(12) United States Patent
Jang (10) Patent No.: US 12,469,947 B2
(45) Date of Patent: Nov. 11, 2025

(54) DIFFERENTIAL WIDEBAND QUADRATURE SIGNAL GENERATION USING OVER-COUPLED DIRECTIONAL COUPLER

(71) Applicant: TEXAS INSTRUMENTS INCORPORATED, Dallas, TX (US)

(72) Inventor: Sun Hwan Jang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 102 days.

(21) Appl. No.: 18/498,547

(22) Filed: Oct. 31, 2023

(65) Prior Publication Data

US 2025/0141080 A1    May 1, 2025

(51) Int. Cl.
*H03F 3/19* (2006.01)
*H01P 5/18* (2006.01)

(52) U.S. Cl.
CPC ........ *H01P 5/18* (2013.01); *H03F 3/19* (2013.01)

(58) Field of Classification Search
CPC ..................................... H01P 5/18; H03F 3/19
See application file for complete search history.

(56) References Cited

U.S. PATENT DOCUMENTS

| | | | |
|---|---|---|---|
| 8,314,742 B2* | 11/2012 | Fujita | H01Q 25/008 342/368 |
| 2008/0111632 A1* | 5/2008 | Gong | H03F 3/195 330/310 |
| 2009/0075613 A1* | 3/2009 | Safarian | H04B 1/18 455/323.1 |
| 2018/0090806 A1* | 3/2018 | Katz | H01P 3/02 |
| 2025/0047240 A1* | 2/2025 | Abdulaziz | H03B 5/1212 |
| 2025/0119127 A1* | 4/2025 | Takeya | H03H 11/20 |

FOREIGN PATENT DOCUMENTS

CN    210123968 U  *  3/2020

* cited by examiner

*Primary Examiner* — Quan Tra
(74) *Attorney, Agent, or Firm* — Michael T. Gabrik; Frank D. Cimino (57) ABSTRACT

Embodiments disclosed herein relate to quadrature signal generation, and more particularly, to wideband differential quadrature signal generation at millimeter-wave frequencies using over-coupled directional couplers. In an example, a quadrature signal generation sub-circuit includes two conductive strips arranged in parallel with respect to each other on different layers of a metal interconnect of a substrate (i.e., during a complementary metal-oxide semiconductor (CMOS) fabrication process) that form a directional coupler. Each conductive strip has a length and a width configured such that an input end of the first conductive strip and a coupled end of the second conductive strip, that are electromagnetically coupled together, produce an over-coupling factor. The input end may be configured to couple to a local oscillator, and the coupled end may be configured to couple to a mixer. The directional coupler may provide, to the mixer, an output of a desired bandwidth based on the over-coupling factor.

20 Claims, 4 Drawing Sheets

DIFFERENTIAL WIDEBAND QUADRATURE SIGNAL GENERATION USING OVER-COUPLED DIRECTIONAL COUPLER

TECHNICAL FIELD

This relates generally to radio frequency signal generation, and more particularly, to using a quadrature signal generator to produce wideband outputs.

BACKGROUND

Radio frequency (RF) signal generation circuits are employed across a wide range of application areas, including telecommunications, telemetry, aerospace applications, wireless data transmission, satellite and radar imaging, and more. RF signal generation circuits may be used to interface with a transmitter or a receiver and produce two signals based on a signal from the local oscillator: one having real values, the other having imaginary values. The two signals may be 90-degrees out-of-phase with respect to each other, which may offer benefits in processing data received and transmitted by the antenna in such application areas.

Various applications may employ signal generation components integrated on systems-on-chip (SoCs) to perform quadrature signal generation. To produce in-phase and 90 degree out-of-phase phase signals, passive structures, such as couplers, may be formed in the metal layers deposited onto a silicon substrate. Many passive structures exist to generate real and imaginary signals, however, such structures may only produce signals at millimeter-wave frequencies with small fractional bandwidths, such as 10 to 15%. Thus, these couplers are often only usable in a certain applications operating only within the narrow bandwidth. To accommodate for bandwidth constraints, some solutions may include digital circuitry to adjust and reconfigure the bandwidth output of a system. However, such solutions increase system complexity, design area requirements, and design cost. Further, reconfiguration of frequency bands using digital circuitry may result in switching the output signals from one band to another band instead of increasing the range of the bandwidth overall.

SUMMARY

Various embodiments disclosed herein relate to differential quadrature signal generation, and more particularly, to generating wideband differential quadrature signals at millimeter-wave frequencies using over-coupled directional couplers. In a quadrature signal generator, conductive strips may be arranged in parallel with respect to each other and on different metal layers deposited onto a silicon substrate to form a directional coupler (e.g., on a metal interconnect deposited onto the silicon substrate). Each conductive strip has a length and a width selectively chosen such that an input end of a first conductive strip of a pair of strips and a coupled end of a second conductive strip of the pair of strips, that are electromagnetically coupled together, produce an over-coupling factor. The input end may be coupled to or connected to a local oscillator, and the coupled and through ends may be configured to couple or connect to quadrature and in-phase mixers, respectively. The directional coupler may provide, to the mixers, an output (e.g., an in-phase or quadrature clock) of a desired bandwidth based on the over-coupling factor.

In an example, a system is provided. The system includes a first amplifier, a first mixer, a second mixer, a local oscillator, a quadrature signal generation sub-circuit, a second amplifier, a third amplifier, a first analog-to-digital converter (ADC), and a second ADC. The first amplifier is configured to couple to an antenna. The first and second mixer are coupled to the first amplifier. The quadrature signal generation sub-circuit is coupled to the first mixer, the second mixer, and the local oscillator. The second amplifier is coupled to the first mixer, and the third amplifier is coupled to the second mixer. The first ADC is coupled to the second amplifier, and the second ADC is coupled to the third amplifier. The quadrature signal generation sub-circuit includes a first conductive strip of a first width and a first length arranged in a first layer of an interconnect of a substrate (e.g., a first metal layer stacked onto a silicon substrate), and a second conductive strip of a second width and a second length arranged in a second layer of the interconnect. The first conductive strip and the second conductive strip are arranged in parallel with respect to each other in respective layers of interconnect such that the first conductive strip and the second conductive strip form a directional coupler. The first conductive strip includes a first end configured to couple to the local oscillator and a second end opposite relative to the first end. The second conductive strip includes a third end configured to couple to the first mixer and electromagnetically coupled to the first end and a fourth end opposite relative to the third end. The first length of the first conductive strip and the second length of the second conductive strip are based on a quarter-wavelength of center frequency of a bandwidth of the directional coupler. Further, the first width of the first conductive strip and the second width of the second conductive strip are configured to produce a coupled gain between the first end and the third end of the directional coupler. The coupled gain between the first end of the first strip and the first end of the third strip may be greater than a throughput gain between the first end and the second end of the first conductive strip.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

The drawings are not necessarily drawn to scale. In the drawings, like reference numerals designate corresponding parts throughout the several views. In some embodiments, components or operations may be separated into different blocks or may be combined into a single block.

DETAILED DESCRIPTION

Discussed herein are enhanced components, techniques, and systems related to quadrature signal generation, and more particularly, to generating a fully-differential wideband quadrature signal at millimeter-wave frequencies using an over-coupled directional coupler. In a quadrature signal generator, a local oscillator may produce a local oscillator signal that is substantially sinusoidal and has a given frequency. The local oscillator may be coupled to a set of mixers via a directional coupler. An example directional coupler is a passive device that includes conductive strips arranged in parallel with respect to each other and on different metal layers of a interconnect of a silicon substrate, such as via a Complementary Metal-Oxide Semiconductor (CMOS) fabrication process, that produces two local oscillator signals, one per mixer, that have substantially equal power and are 90° out of phase with respect to each other (e.g., an in-phase local oscillator signal and a quadrature local oscillator signal).

Each conductive strip has a length and a width selectively chosen such that an input end of a first conductive strip of a pair of strips and a coupled end of a second conductive strip of the pair of strips, that are electromagnetically coupled together, produce an over-coupling factor. Because of the passive nature, many directional couplers only provide suitable local oscillator signals to the mixers if the local oscillator signal frequency falls within a very narrow range of frequencies that the coupler is optimized for. However, some examples of the present disclosure provide a directional coupler that provides suitable local oscillator signals over a wide range of frequencies (e.g., have a bandwidth) based on the over-coupling factor allowing the same directional coupler design to be used in products that support multiple local oscillator signal frequencies and can be used in different products without redesign (e.g., a directional coupler design that can be used in 60 GHz radar and 80 GHz radar products).

In contrast, existing coupling devices may only produce signals of a certain bandwidth and within approximately 10-15% of the fractional bandwidth with respect to the center frequency. Thus, for applications that require wider bands or different bands, such new or re-configured coupling devices may need to be used to accomplish desired operating parameters. This may require separate designs for systems operating at different frequency bands, which may increase system complexity, design effort, and cost. The system, instead, may also be limited to certain bandwidths entirely.

Disclosed herein is a system that utilizes over-coupling techniques for directional couplers that allows the system to produce quadrature signals for data processing over a wider fractional bandwidth. Dimensions of coupled conductive strips may be selected at a quarter-wavelength of the center frequency within the desired bandwidth such that over-coupling occurs between the input ports and the coupled ports of a directional coupler formed using the conductive strips placed in different metal layers. Advantageously, the disclosed system and circuits thereof can achieve improved performance with respect to fractional bandwidth (e.g., approximately 30% of the center frequency) while reducing the need for additional design operating at different but adjacent frequency bands, design resources, and cost, among other things.

In an example embodiment, a system is provided. The system includes a first amplifier, a first mixer, a second mixer, a local oscillator, a quadrature signal generation sub-circuit, a second amplifier, a third amplifier, a first analog-to-digital converter (ADC), and a second ADC. The first amplifier is configured to couple to an antenna. The first and second mixer are coupled to the first amplifier. The quadrature signal generation sub-circuit is coupled to the first mixer, the second mixer, and the local oscillator. The second amplifier is coupled to the first mixer, and the third amplifier is coupled to the second mixer. The first ADC is coupled to the second amplifier, and the second ADC is coupled to the third amplifier. The quadrature signal generation sub-circuit includes a first conductive strip of a first width and a first length arranged in a first layer of an interconnect of a substrate, and a second conductive strip of a second width and a second length arranged in a second layer of the interconnect. The first conductive strip and the second conductive strip are arranged in parallel with respect to each other in respective layers of the interconnect such that the first conductive strip and the second conductive strip form a directional coupler. The first conductive strip includes a first end configured to couple to the local oscillator and a second end opposite relative to the first end. The second conductive strip includes a third end configured to couple to the first mixer and electromagnetically coupled to the first end and a fourth end opposite relative to the third end. The first length of the first conductive strip and the second length of the second conductive strip are based on a quarter-wavelength of the center frequency of a bandwidth of the directional coupler. Further, the first width of the first conductive strip and the second width of the second conductive strip are configured to produce a coupled gain between the first end and the third end of the directional coupler. The coupled gain between the first end of the first conductive strip and the first end of the second strip may be greater than a throughput gain between the first end and the second end of the first conductive strip.

In another example embodiment, a device is provided. The device includes a first conductive strip of a first width and a first length arranged in a first layer of an interconnect of a substrate, and a second conductive strip of a second width and a second length arranged in a second layer of the interconnect. The first conductive strip and the second conductive strip are arranged in parallel with respect to each other in respective layers of the interconnect such that the first conductive strip and the second conductive strip form a directional coupler. The first conductive strip includes a first end configured to couple to the local oscillator and a second end opposite relative to the first end. The second conductive strip includes a third end configured to couple to the first mixer and electromagnetically coupled to the first end and a fourth end opposite relative to the third end. The first length of the first conductive strip and the second length of the second conductive strip are based on a quarter-wavelength of a center frequency of a bandwidth of the directional coupler. Further, the first width of the first conductive strip and the second width of the second conductive strip are configured to produce a coupled gain between the first end and the third end of the directional coupler. The coupled gain between the first end of the first conductive strip and the first end of the second strip may be greater than a throughput gain between the first end and the second end of the first conductive strip.

In yet another example embodiment, a device is provided. The device includes a first conductive strip of a first width and a first length arranged in a first layer of an interconnect of a substrate, a second conductive strip of a second width and a second length arranged in a second layer of the interconnect, a third conductive strip of a third width and a third length arranged in the first layer of the interconnect, and a fourth conductive strip of a fourth width and a fourth length arranged in the second layer of the interconnect. The first conductive strip and the second conductive strip are arranged in parallel with respect to each other in respective layers of the interconnect such that the first conductive strip and the second conductive strip form a directional coupler. The third conductive strip and the fourth conductive strip are arranged in parallel with respect to each other in respective layers of the interconnect such that the third conductive strip and the fourth conductive strip form a second directional coupler. The first conductive strip includes a first end configured to couple to the local oscillator and a second end opposite relative to the first end. The second conductive strip includes a third end configured to couple to the first mixer and electromagnetically coupled to the first end and a fourth end opposite relative to the third end. The third conductive strip includes a fifth end configured to couple to the local oscillator and a sixth end opposite relative to the fifth end. The fourth conductive strip includes a seventh end configured to couple to the second mixer and electromagnetically coupled to the fifth end and an eighth end opposite relative to the seventh end coupled to the resistor. The first length, the second length, the third length, and the fourth length are based on a quarter-wavelength of the center frequency of a bandwidth of the first and second directional couplers. The first width and the second width are configured to produce a first coupled gain between the first end and the third end of the first directional coupler. The first coupled gain between the first end of the first strip and the third end of second strip is greater than a first throughput gain between the first end and the second end of the first conductive strip. The third width and the fourth width are configured to produce a second coupled gain between the fifth end and the seventh end of the second directional coupler, wherein the second coupled gain between the fifth end of the third strip and the seventh end of the fourth strip is greater than a second throughput gain between the fifth end and the sixth end of the third conductive strip.

Figure 1:
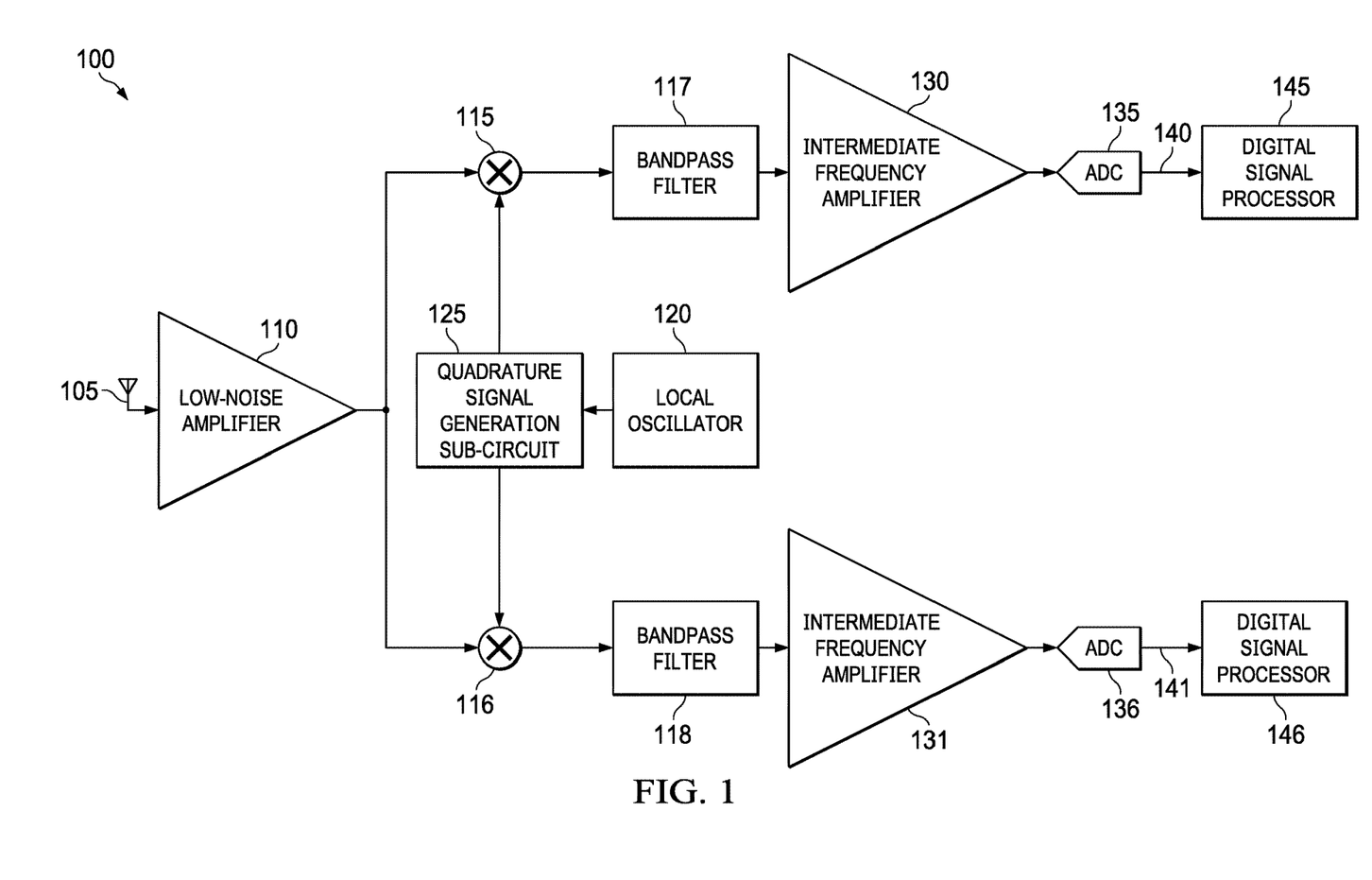
FIG. 1 illustrates an operating environment for quadrature signal generation that may be used in accordance with an embodiment.

FIG. 1 illustrates an example operating environment for quadrature signal generation that may be used in accordance with an embodiment. FIG. 1 includes operating environment 100, which includes antenna 105, low-noise amplifier (LNA) 110, mixer 115 (e.g., an in-phase mixer), mixer 116 (e.g., a quadrature mixer), bandpass filter 117, bandpass filter 118, local oscillator (LO) 120, quadrature signal generation sub-circuit 125, intermediate frequency (IF) amplifier 130, IF amplifier 131, analog-to-digital converter (ADC) 135, ADC 136, digital signal processor (DSP) 145, and DSP 146. In various examples, quadrature signal generation sub-circuit 125 is configured to generate two output signals, provide a first output signal to mixer 115, and provide a second output signal to mixer 116, which may undergo further processing resulting in outputs 140 and 141, respectively.

The system shown in operating environment 100 is representative of one or more circuits integrated on-chip (e.g., a system-on-chip (SoC)), such as via a CMOS fabrication process, capable of processing signals received by antenna 105 for downstream usage. The integrated chip may employ one or more types of conductive traces, strips, solder types, dielectric materials, and other components to perform signal reception and processing functionality. For example, the system may be employed to receive and process radar data from antenna 105. However, other uses may be contemplated. In some embodiments, the system may include additional or fewer components than shown with respect to FIG. 1.

Antenna 105 is included and is representative of an antenna capable of receiving signals over the air and converting the signals to electrical currents. Antenna 105 may operate in various bandwidths and radio frequencies, such as in narrow-band or wide-band. Antenna 105 may be coupled to provide received signals to LNA 110.

LNA 110 is representative of a low-noise amplifier, including various electronic elements such as inductors, transistors, and the like, capable of amplifying the signals received via antenna 105 while minimizing degradation of the signal-to-noise ratio of signals and matching the impedance of the signals to improve power transmission over various bands. LNA 110 may be coupled to or connected to provide the amplified signal to both mixer 115 and mixer 116.

Mixers 115 and 116 are representative of electronic mixers that may include one or more electronic components capable of combining two or more signals in operating environment 100, such as the amplified signal from LNA 110 and signals from quadrature signal generation sub-circuit 125, to produce down-converted signal. More specifically, mixer 115 may be coupled to receive the amplified signal from LNA 110 and a signal from quadrature signal generation sub-circuit 125 and coupled to provide a first down-converted signal to bandpass filter 117. Mixer 116 may be coupled to receive the amplified signal from LNA 110 and a signal from quadrature signal generation sub-circuit 125 and coupled to provide a second down-converted signal to bandpass filter 118. The bandpass filters 117 and 118 may provide filtering to the signals provided by mixers 115 and 116, respectively, and output filtered signals to IF amplifier 130 and IF amplifier 131, respectively. In various examples, mixers 115 and 116 may operate as downconverters, however, in other examples, mixers 115 and 116 may instead or additionally operate as upconverters.

Quadrature signal generation sub-circuit 125 is representative of a quadrature signal generator capable of generating signals having both in-phase and quadrature parts based on signals provided by local oscillator 120. In various examples, quadrature signal generation sub-circuit 125 generates one or more signals having a first phase and one or more different signals having a second phase. The first phase and the second phase may be 90-degrees out-of-phase with respect to one another. For example, the first phase may be 0 degrees, while the second phase may be 90 degrees. However, any other combinations or variations may be contemplated. The signals generated by quadrature signal generation sub-circuit 125 may also have different polarities with respect to one another. For example, quadrature signal generation sub-circuit 125 may produce a first signal having the first phase that is a positive signal, a second signal having the first phase that is a negative signal, a third signal having the second phase that is a positive signal, and a fourth signal having the second phase that is a negative signal.

To generate such differential quadrature signals, quadrature signal generation sub-circuit 125 may include one or more directional couplers formed using conductive strips on layers of an interconnect of a substrate (e.g., a Silicon substrate) during a CMOS fabrication process. Quadrature signal generation sub-circuit 125 may include two conductive strips on a first layer of a substrate and two conductive strips on a second layer of the substrate. The conductive strips of the first layer and the second layer may be positioned within respective layers such that the conductive strips form two different directional couplers. In various examples, the conductive strips may include microstrips, embedded microstrips, or embedded striplines, however, other types of conductive strips or traces may be used. The conductive strips may be rectangularly-shaped, or any other type of shape. In an example, the first and second layers may be metal layers formed on the substrate, and the conductive strips may be stacked, or otherwise arranged, on the metal layers during a CMOS process.

A first directional coupler may include a first strip located in a first layer of a metal interconnect deposited onto a substrate and a second strip located in a second layer of the interconnect of the substrate. The first layer and the second layer may be different layers within the interconnect, such as a top layer and a layer directly beneath the top layer, respectively. The first strip and the second strip may be arranged within the respective layers such that the first strip is positioned directly over and in parallel with respect to the second strip. Similarly, a second directional coupler may include a third strip located in the first layer of the interconnect and a fourth strip located in the second layer of the interconnect, and the third and fourth strips may also be arranged in parallel with respect to each other. The first and third strips of the first layer may be positioned a distance apart from each other, and the second and fourth strips of the second layer may be positioned a distance apart from each other. An illustration of such positioning of the conductive strips is depicted in FIG. 2C and described below.

Each of the conductive strips includes two ends that may be coupled to or connected to other components in operating environment 100. A first end may be located on a proximal side of the respective strip, and a second end may be located on a distal side of the respective strip. In reference to the first directional coupler, the first end of the first conductive strip may be referred to as the input port of the first directional coupler, the second end of the first conductive strip may be referred to as the through port of the directional coupler, the first end of the third conductive strip may be referred to as the coupled port of the first directional coupler, and the second end of the third conductive strip may be referred to as the isolated port of the first directional coupler. In reference to the second directional coupler, the first end of the second conductive strip may be referred to as the input port of the second directional coupler, the second end of the second conductive strip may be referred to as the through port of the second directional coupler, the first end of the fourth conductive strip may be referred to as the coupled port of the second directional coupler, and the second end of the fourth conductive strip may be referred to as the isolated port of the second directional coupler. For each directional coupler, the input port and the coupled port of the conductive strips may be aligned with each other in the same vertical plane in respective layers of the interconnect, and the through port and the isolated port may be aligned with each other in the same vertical plane in respective layers of the interconnect. Further, the input ports and the coupled ports of the directional couplers may be electromagnetically coupled together.

In various examples, the input ports of the directional couplers, or the first ends of the first conductive strip and the second conductive strip, may be coupled to local oscillator 120. Local oscillator 120 is representative of a timing circuit having an oscillator capable of generating differential clock signals. Local oscillator 120 may be coupled to or connected to provide a positive input signal (e.g., a local oscillator signal and/or a clock signal) to the input port of the first directional coupler and a negative input signal that has substantially the same amplitude, phase, and frequency as positive input signal to the input port of the second directional coupler. When local oscillator 120 supplies the input signals to the directional couplers, the signals may travel electrically through the top conductive strip (e.g., first conductive strip, second conductive strip) and electromagnetically from the top conductive strip to the bottom conductive strip (e.g., third conductive strip, fourth conductive strip). In various examples, based on factors such as the dimensions of the conductive strips, the coupling coefficients of the conductive strips, and the proximity of the conductive strips within a given directional coupler, at the center frequency, the gain of the signals may be higher at the coupled ports of the directional couplers than at the through ports of the directional couplers (i.e., over-coupled). Specifically, the coupling factor may be approximately 2.7 dB at the coupled port of the directional couplers in some examples, where it is 3 dB for equal power split between the coupled port and the through port. For examples where the directional coupler design is intended to be suitable for multiple local oscillator frequencies, the center frequency may be selected to be between the various frequencies (e.g., about 67.5 GHz for a directional coupler suitable for 60 GHz and 80 GHz local oscillator applications).

Additionally, the phases of the signals may differ after passing through the directional couplers. For example, the signal at the through port of the first directional coupler may be a positive signal having a phase of 90 degrees, the signal at the through port of the second directional coupler may be a negative signal having a phase of 90 degrees, and hence 270 degrees, the signal at the coupled port of the first directional coupler may be a positive signal having a phase of 0 degrees, and the signal at the coupled port of the second directional coupler may be a negative signal having a phase of 0 degrees, and hence 180 degrees. Accordingly, the directional couplers may generate signals having a gain and of a different bandwidth and phase than the input signal provided by local oscillator 120.

Mixers 115 and 116 may be coupled to or connected with ends of the directional couplers to receive the signals generated by the directional couplers. For example, mixer 115 may be coupled at the through ports of the directional couplers to receive the differential 90-degree signals, and mixer 116 may be coupled at the coupled ports of the directional couplers to receive the differential 0-degree signals. More specifically, mixers 115 and 116 may connect to traces on the interconnect to receive the signals from the ends of the conductive strips.

The dimensions of the conductive strips (length, width, height), the proximity between the first and third conductive strips (i.e., the first directional coupler), and the proximity between the second and fourth conductive strips (i.e., the second directional coupler) may be selectively chosen based on a desired performance of the directional couplers. For example, in operation, the directional couplers, when coupled to receive signals from local oscillator 120, may produce differential quadrature signals over a certain desired bandwidth. Thus, the dimensions and proximities may influence the bandwidth and/or gain of the directional couplers. Advantageously, based on the over-coupling of the conductive strips of each directional coupler, a wide bandwidth may be realized by differential quadrature signal generation sub-circuit 125 (e.g., 50-85 GHz).

Mixers 115 and 116 can multiply the received signals from LNA 110 with the signals received from quadrature signal generation sub-circuit 125 and provide the down-converted signals to IF amplifiers 130 and 131, respectively. IF amplifiers 130 and 131 are configured to further amplify the mixed signals in the receiver channel. IF amplifier 130 may be coupled to or connected to provide a signal to ADC 135, and IF amplifier 131 may be coupled to or connected to provide a signal to ADC 136.

ADCs 135 and 136 are included to convert the down-converted and amplified analog signal to a digital signal. ADC 135 may convert a respective signal to produce output 140. ADC 136 may convert a respective signal and produce output 141. Outputs 140 and 141 may represent digital signals received by antenna 105 following conversion, amplification, modulation, and other processing. In various examples, ADCs 135 and 136 may provide outputs 140 and 141, respectively, to digital signal processing (DSP) engine or another downstream processing module, such as digital signal processors 145 and 146, respectively.

Figure 2A:
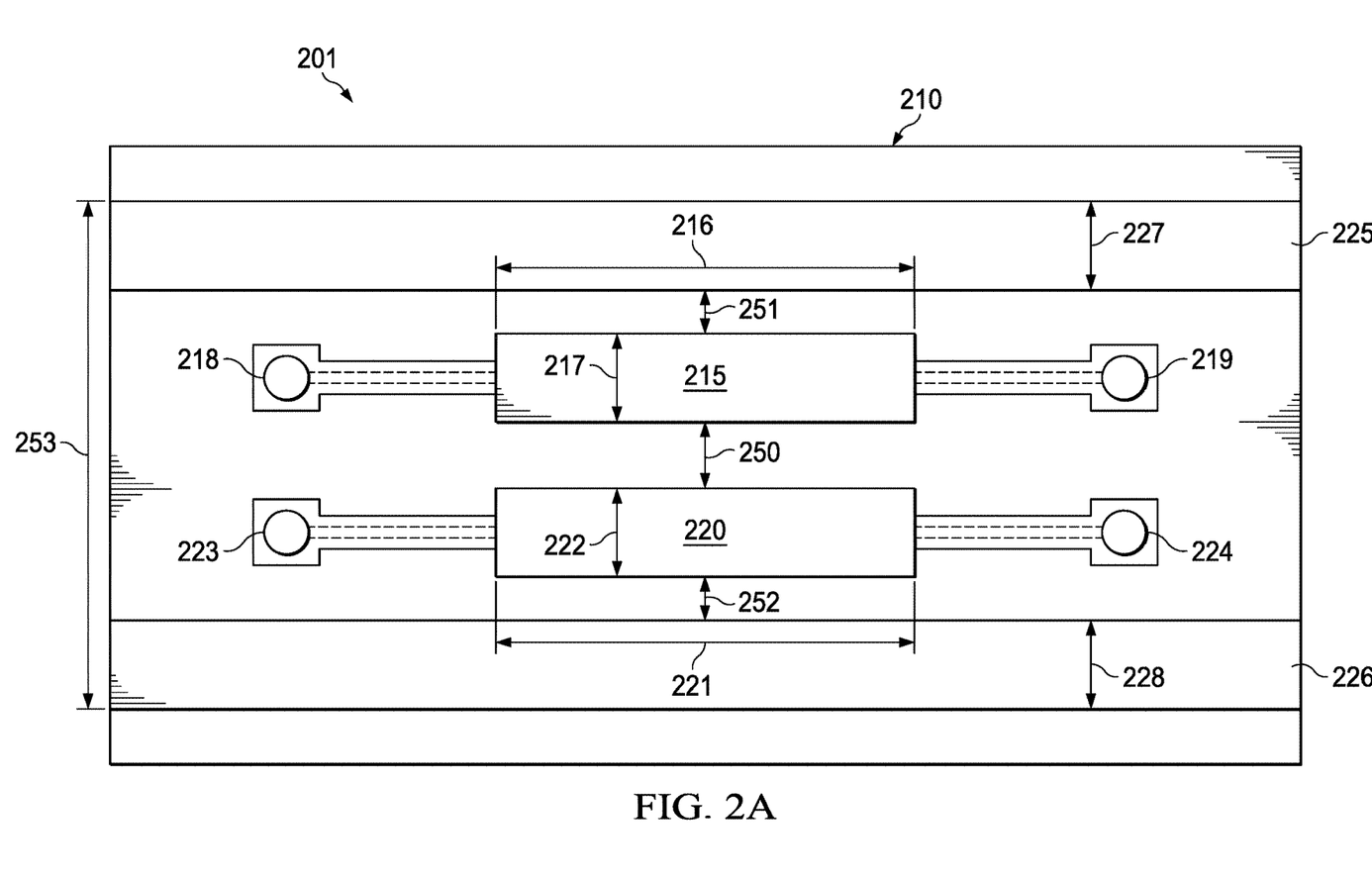
FIGS. 2A, 2B, and 2C illustrate aspects of conductive features used in a quadrature signal generation sub-circuit in accordance with an embodiment.
Figure 2B:
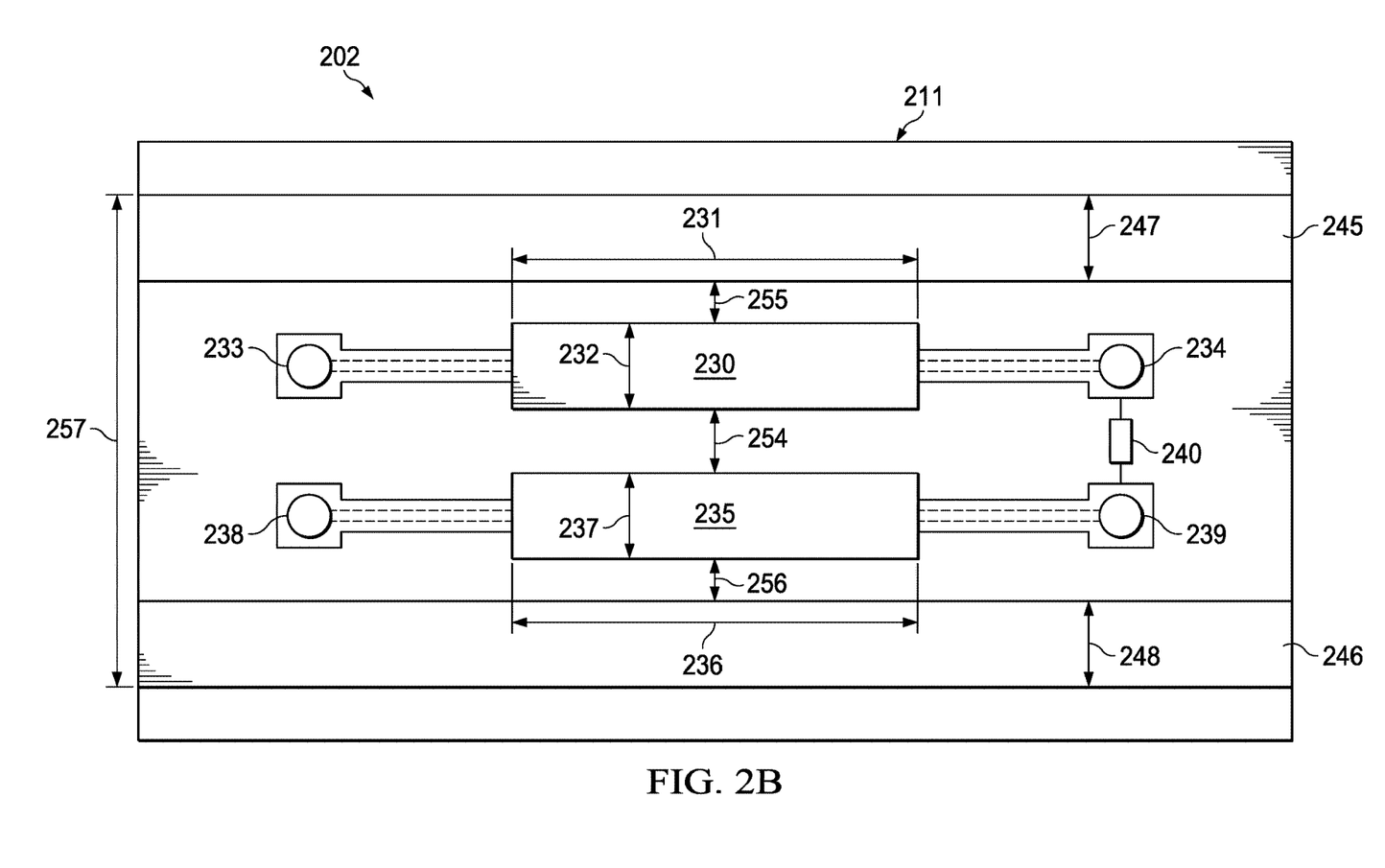
Figure 2C:
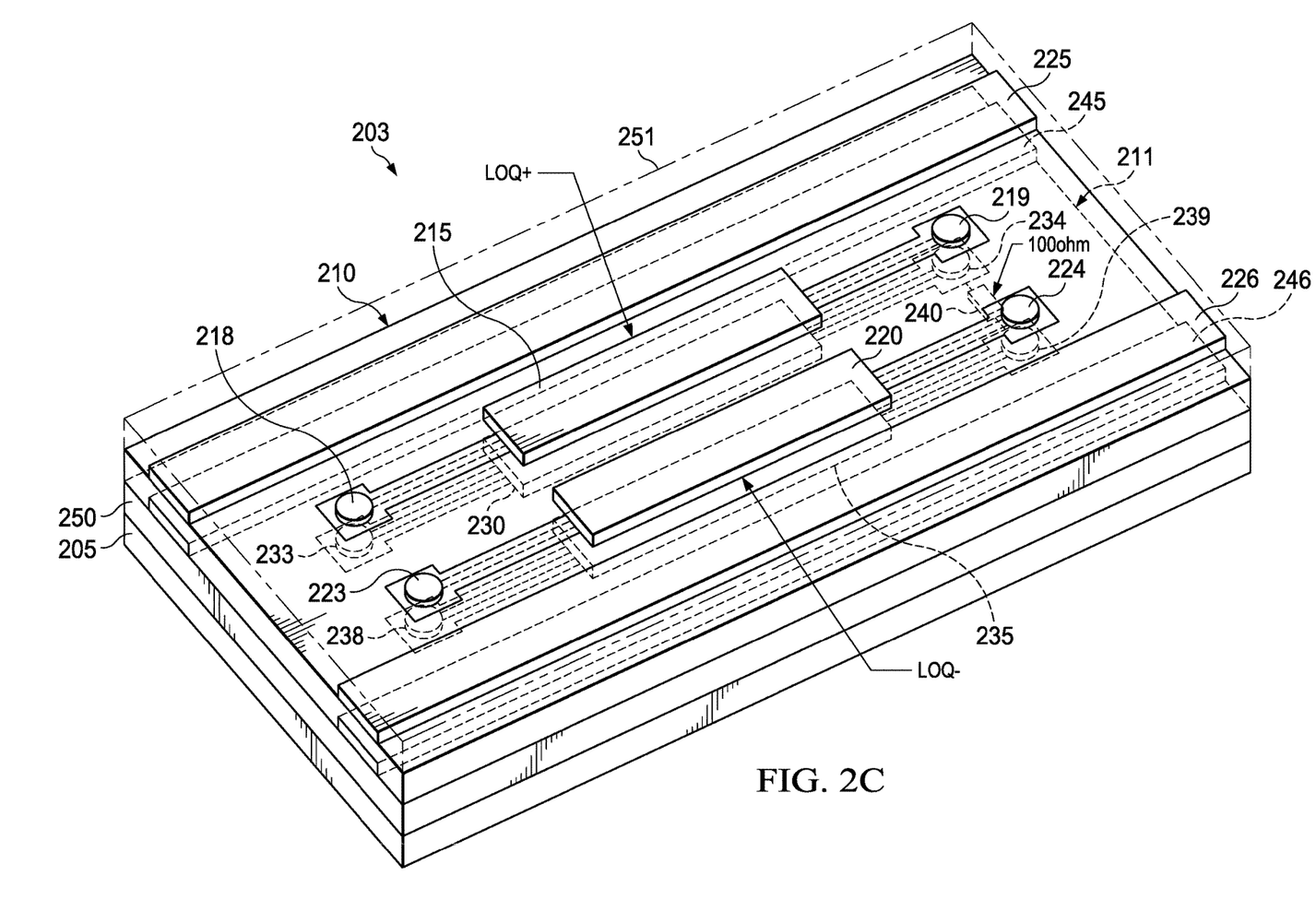

FIGS. 2A, 2B, and 2C illustrate aspects of conductive features used in a quadrature signal generation sub-circuit in accordance with an embodiment. FIG. 2A includes aspect 201, which shows a top-down view of a first layer 210 of a metal layer of an interconnect deposited onto a substrate and components arranged on layer 210 of the interconnect. Layer 210 includes conductive features in the form of strips 215 and 220, nodes 218, 219, 223, and 224, and ground planes 225 and 226. The conductive features of layer 210 are disposed within an inter-layer dielectric (ILD), which is omitted to better illustrate the conductive features. FIG. 2B includes aspect 202, which shows a top-down view of a second layer 211 of the interconnect and components arranged on layer 211 of the interconnect. Layer 211 includes conductive features in the form of strips 230 and 235, nodes 233, 234, 238, and 239, resistor 240, and ground planes 245 and 246. The conductive features of layer 211 are disposed within an ILD, which is omitted to better illustrate the conductive features. FIG. 2C includes aspect 203, which shows a three-dimensional, isometric view of layers 210 and 211 of the circuit board 205. In various examples, components of the circuit board may be configured to perform quadrature signal generation processes.

Referring first to aspect 201 of FIG. 2A, aspect 201 demonstrates a view of components onboard layer 210 of an interconnect of a substrate, such as a metal layer deposited onto a substrate during a CMOS process, representative of a quadrature signal generator (e.g., quadrature signal generation sub-circuit 125 of FIG. 1). In various examples, layer 210 may be a top layer of the substrate. In other examples, layer 210 may be a layer other than the top layer of the interconnect. Components show in aspect 201 may be embedded or otherwise affixed on layer 210.

Strips 215 and 220 are included on layer 210 and are representative of conductive strips (e.g., coupled strips) that form part of two different directional couplers. In various examples, strips 215 and 220 may be made of a conductive metal having lengths 216 and 221, respectively, widths 217 and 222, respectively, and depths, which are dependent on the CMOS process. In an example, strips 215 and 220 are rectangular in shape, however, other shapes, including tapered shapes may be used. Each of strips 215 and 220 include two ends that can be used as inputs or outputs for the quadrature signal generator. A first end of strip 215 may be coupled to node 218, and a second end of strip 215 may be coupled to node 219. A first end of strip 220 may be coupled to node 223, and a second end of strip 220 may be coupled to node 224. Nodes 218, 219, 223, and 224 may be representative of ports, pins, or pads of the interconnect that can couple or connect (i.e., physically) components to strips 215 and 220, respectively. The first ends of strips 215 and 220 may be referred to as input ports, while the second ends of strips 215 and 220 may be referred to as through ports.

In various examples, the input ports of strips 215 and 220 may be coupled to or connected to a local oscillator (e.g., local oscillator 120 of FIG. 1) via nodes 218 and 223. The local oscillator may supply a differential local oscillator signal by providing a positive local oscillator signal to strip 215 via node 218 and a negative local oscillator signal having substantially the same amplitude, phase, and frequency as the positive local oscillator signal to strip 220 via node 223. The through ports of strips 215 and 220 may be coupled to or connected to a mixer (e.g., mixer 115 of FIG. 1) via nodes 219 and 224. When signals are supplied to strips 215 and 220, the signals may travel from the first end to the second end of strips 215 and 220 to the mixer via nodes 219 and 224. The signals received by the mixer may have a phase of 90 degrees relative to signals received by a second mixer (e.g., mixer 116 of FIG. 1). However, signals of other phases may be used.

Layer 210 further includes ground planes 225 and 226. Ground planes 225 and 226 may have widths 227 and 228, respectively. Ground planes 225 and 226 may be connected to other metal layers below the layer 210 and 211 (of aspect 202 of FIG. 2B) in the substrate through vias. The vias may allow elements of layer 210, such as ground planes 225 and 226 to be connected to elements of other layers of the interconnect.

The dimensions of strips 215 and 220, ground planes 227 and 228, the total width 253 of strip 215, strip 220, ground plane 227, and ground plane 228, and the gap widths between each of these elements, such as gap 250 between strips 215 and 220, gap 251 between strip 215 and ground plane 225, and gap 252 between strip 220 and ground plane 226 may be configured to produce a desired performance of conductivity and coupling gain. For example, such dimensions may affect the gain and phase of the signals traveling from the first ends of the strips to the second ends of the strips. Further, such dimensions may further affect the coupling gain between strips 215 and 220 of layer 210 and strips 230 and 235 of layer 211 of FIG. 2B, referred to next. In an example, lengths 216 and 221 of strips 215 and 220, respectively, may each be 450 µm. Further, total width 253 of the elements on the interconnect may be 80 µm. Total width 253 may allow the strips, when they form a directional coupler with strips below them, to have a characteristic impedance of approximately 100 Ohms. Importantly, this may provide impedance matching while also producing an over-coupled gain when signals are transmitted through strips 215 and 220. In other examples, other dimensions may be contemplated.

Now referring to FIG. 2B, aspect 202 shows layer 211 of the interconnect, which may represent a layer below layer 210 within the interconnect. In various examples, layer 211 is the layer directly beneath layer 210. More specifically, in an interconnect with 9 layers deposited onto the substrate, layer 210 may be the top layer, or the $9^{th}$ layer, and layer 211 may be the $8^{th}$ layer. There may further be dielectric layers between each of the layers, including between layers 210 and 211.

Layer 211 includes strips 230 and 235, which are included as the other part of the two different directional couplers. Strips 230 and 235 may also include conductive strips of a rectangular shape, and they may be positioned in the same way as strips 215 and 220 of layer 210, directly below strips 215 and 220, respectively, and in parallel with strips 215 and 220, respectively. Accordingly, in use, strips 215 and 230 form a first directional coupler, and strips 220 and 235 form a second directional coupler in the interconnect.

In various examples, strips 230 and 235 may be made of a conductive metal having lengths 231 and 236, respectively, widths 232 and 237, respectively, and depths, which are dependent on the CMOS process. Each of strips 230 and 235 include two ends that can be used as outputs for the quadrature signal generator. A first end of strip 230 may be coupled to node 233, and a second end of strip 230 may be coupled to node 234. A first end of strip 235 may be coupled to node 238, and a second end of strip 235 may be coupled to node 239. Nodes 233, 234, 238, and 239 may be representative of ports, pins, or pads of the which are dependent on the CMOS process that can couple or connect components to strips 230 and 235, respectively. For example, resistor 240 may be coupled to or connected to strips 230 and 235 via nodes 234 and 239. The first ends of strips 230 and 235 may be referred to as coupled ports, while the second ends of strips 230 and 235 may be referred to as isolated ports.

In various examples, the coupled ports of strips 230 and 235 may be electromagnetically coupled to the input ports of strips 215 and 220, respectively, through layers 210 and 211 of the interconnect. The coupled ports may be coupled to or connected to a different mixer (e.g., mixer 116 of FIG. 1) via nodes 233 and 238. When the local oscillator supplies differential signals to the input ports of strips 215 and 220, a coupling factor is created between the input ports and the coupled ports. In various examples, the coupling factor between the input ports and the coupled ports may produce a coupled gain greater gain than the throughput gain between the input ports and the through ports. This may be referred to as over-coupling, as more power is delivered to the coupled ports than the through ports. The second mixer may receive a positive signal from strip 230 via node 233 and a negative signal from strip 235 via node 238. The signals received by the second mixer may have a phase 90 degrees out-of-phase with respect to the signals received by the mixer from strips 215 and 220 via nodes 219 and 224, respectively. For example, the signals received by the second mixer may have a phase of 0 degrees or some other number of degrees that is 90 degrees different relative to the other phase of the signals received by the first mixer.

Layer 211 further includes ground planes 245 and 246. Ground planes 245 and 246 may have widths 247 and 248. Ground planes 245 and 246 may be connected through vias to other metal layers below layer 211 of the interconnect. For example, ground planes 245 and 246 may be connected to ground planes 225 and 226, respectively, of layer 210, among other components of layer 210.

The dimensions of strips 230 and 235, ground planes 245 and 246, the total width 257 of strip 230, strip 235, ground plane 245, and ground plane 246, and the gap widths between each of these elements, such as gap 254 between strips 230 and 235, gap 255 between strip 230 and ground plane 245, and gap 256 between strip 235 and ground plane 246 may be configured to produce a desired performance of conductivity and coupling gain. For example, such dimensions may affect the gain and phase of the signals traveling from the first ends of the strips to the second ends of the strips. Further, such dimensions may further affect the coupling gain between strips 215 and 220 of layer 210 and strips 230 and 235. In an example, lengths 231 and 236 of strips 230 and 235, respectively, may each be 450 µm. Further, total width 257 of the elements on the interconnect may be 80 µm. Total width 257 may allow the strips, when they form a directional coupler with strips below them, to have a characteristic impedance of approximately 100 Ohms. Importantly, this may provide impedance matching while also producing an over-coupled gain when signals are transmitted through strips 230 and 235. In other examples, other dimensions may be contemplated.

Referring next to FIG. 2C, FIG. 2C includes aspect 203, which demonstrates a 3D model of layers 210 and 211, and components thereof, of interconnect 205, representative of a CMOS process interconnect. As illustrated, layer 210 may be the top layer of interconnect 205, and layer 211 may be the layer directly beneath layer 210 in interconnect 205. Accordingly, components of layer 210 may be positioned above and in parallel with components of layer 211. More specifically, strips 215 and 220 may be positioned above and in parallel with strips 230 and 235, respectively, and ground planes 225 and 226 may be positioned above and in parallel with ground planes 245 and 246, respectively. As mentioned, the dimensions of strips 215, 220, 230, and 235 may affect the coupling factor, and consequently the coupled gain, and throughput gain of the directional couplers. Additionally, the proximity between strips 215 and 230 and strips 220 and 235 may further influence performance of the directional couplers.

ILD layer 250 may be included between layers 210 and 211. ILD layer 251 may be included on top of layer 210. Additional layers of dielectric material may be included between other layers of interconnect 205 as well. ILD layers 250 and 251 include dielectric material formed using various materials, used in standard silicon processes (e.g., CMOS, SiGe BiCMOS, etc.). The type of ILD layer 250 and the thickness thereof may be defined by each silicon process.

Various signal vias may be included in interconnect 205 between layer 210, layer 211, ILD layer 250, and ILD layer 251, among other layers of interconnect 205. The signal vias can span from layer to layer, externally and/or internally. For example, a signal via may provide a connection from node 218, and consequently to strip 215, from another layer of interconnect 205 or to a component external to the interconnect.

Different material compositions, dimensions (e.g., thicknesses, lengths, widths), arrangements, and shapes of the signal vias, conductive strips, ground planes, dielectric materials, and the like may also be selected to alter or suit desired operating characteristics of the differential quadrature signal generation sub-circuit and the receiver channel overall, such as operating gain, bandwidth, and impedance.

While some examples provided herein are described in the context of a signal receiver or quadrature signal generation system, circuit, sub-circuit, component, element, architecture, or environment, the systems, circuits, and methods described herein are not limited to such embodiments and may apply to a variety of other processes, systems, applications, devices, and the like.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or elements are presented in a given order, alternative implementations may perform routines having steps, or employ systems having elements or components, in a different order, and some processes or elements may be deleted, moved, added, subdivided, combined, and/or modified to provide alternative or subcombinations. Each of these processes or elements may be implemented in a variety of different ways. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A system, comprising:
   a first amplifier configured to couple to an antenna;
   a first mixer and a second mixer coupled to the first amplifier;
   a local oscillator;
   a quadrature signal generation sub-circuit coupled to the first mixer, the second mixer, and the local oscillator;
   a second amplifier coupled to the first mixer;
   a third amplifier coupled to the second mixer;
   a first analog-to-digital converter (ADC) coupled to the first amplifier; and
   a second ADC coupled to the second amplifier;
   wherein the quadrature signal generation sub-circuit comprises:
      a first conductive strip of a first width and a first length arranged in a first layer of an interconnect of a substrate; and
      a second conductive strip of a second width and a second length arranged in a second layer of the interconnect;
      wherein the first conductive strip and the second conductive strip are arranged in parallel with respect to each other in respective layers of the interconnect such that the first conductive strip and the second conductive strip form a directional coupler;
      wherein the first conductive strip includes a first end configured to couple to the local oscillator and a second end opposite relative to the first end;
      wherein the second conductive strip includes a third end configured to couple to the first mixer and electromagnetically coupled to the first end and a fourth end opposite relative to the third end;
      wherein the first length of the first conductive strip and the second length of the second conductive strip are based on a quarter-wavelength of a center frequency of a bandwidth of the directional coupler; and
      wherein the first width of the first conductive strip and the second width of the second conductive strip are selectively chosen based on a coupled gain between the first end and the third end of the directional coupler, wherein a desired coupled gain is greater than a throughput gain between the first end and the second end of the first conductive strip.

2. The system of claim 1, wherein the quadrature signal generation sub-circuit further comprises:
   a third conductive strip of a third width and a third length arranged in the first layer of the interconnect; and
   a fourth conductive strip of a fourth width and a fourth length arranged in the second layer of the interconnect;
   wherein the third conductive strip and the fourth conductive strip are arranged in parallel with respect to each other in respective layers of the interconnect such that the third conductive strip and the fourth conductive strip form a second directional coupler;
   wherein the third conductive strip includes a fifth end configured to couple to the local oscillator and a sixth end opposite relative to the fifth end;
   wherein the fourth conductive strip includes a seventh end configured to couple to the second mixer and electromagnetically coupled to the fifth end and an eighth end opposite relative to the seventh end;
   wherein the third length of the third conductive strip and the fourth length of the fourth conductive strip are based on the quarter-wavelength of the center frequency of the bandwidth; and
   wherein the third width of the third conductive strip and the fourth width of the fourth conductive strip are configured to produce a further coupled gain between the fifth end and the seventh end of the second directional coupler, wherein the further coupled gain is greater than a further throughput gain between the fifth end and the sixth end of the third conductive strip.

3. The system of claim 2, wherein the quadrature signal generation sub-circuit further comprises a resistor coupled to the fourth end of the second conductive strip and to the eighth end of the fourth conductive strip.

4. The system of claim 2, wherein the directional coupler is configured to generate a first signal based on the local oscillator providing a positive signal to the first end of the first conductive strip and provide, via the third end of the first conductive strip, the first signal to the first mixer.

5. The system of claim 4, wherein the second directional coupler is configured to generate a second signal based on the local oscillator providing a negative signal to the fifth end of the third conductive strip and provide, via the seventh end of the fourth conductive strip, the second signal to the second mixer.

6. The system of claim 5, wherein the first signal has a first phase, wherein the second signal has a second phase, and wherein the first signal and the second signal are 90-degrees out-of-phase with respect to each other.

7. The system of claim 2, wherein the bandwidth is approximately between 50 and 85 GHz, and wherein the center frequency for the quarter-wavelength of the bandwidth is approximately 67.5 GHz.

8. The system of claim 7, wherein the coupled gain and the further coupled gain are approximately 2.7 dB, and wherein a first coupling coefficient of the directional coupler and a second coupling coefficient of the second directional coupler are selectively chosen such that the coupled gain and the further coupled gain occur at the center frequency for the quarter-wavelength within a desired bandwidth.

9. The system of claim 2, wherein the quadrature signal generation sub-circuit further comprises one or more ground planes arranged on the first layer of the interconnect, one or more further ground planes arranged on the second layer of the interconnect, a fifth conductive strip arranged on a third layer of the interconnect, and one or more vias between the first, second, and third layers of the interconnect, wherein the one or more ground planes and the one or more further ground planes are coupled to the fifth conductive strip by the one or more vias.

10. A device, comprising:
a first conductive strip of a first width and a first length arranged in a first layer of an interconnect of a substrate; and
a second conductive strip of a second width and a second length arranged in a second layer of the interconnect;
wherein the first conductive strip and the second conductive strip are arranged in parallel with respect to each other in respective layers of the interconnect such that the first conductive strip and the second conductive strip form a directional coupler;
wherein the first conductive strip includes a first end configured to couple to a local oscillator and includes a second end opposite relative the first end;
wherein the second conductive strip includes a third end configured to couple to a first mixer and electromagnetically coupled to the first end and includes a fourth end opposite relative the third end;
wherein the first length of the first conductive strip and the second length of the second conductive strip are selectively chosen based on a quarter-wavelength of a bandwidth of the directional coupler; and
wherein the first width of the first conductive strip and the second width of the second conductive strip are configured to produce a coupled gain between the first end and the third end of the directional coupler, wherein the coupled gain is greater than a throughput gain between the first end and the second end of the first conductive strip.

11. The device of claim 10, further comprising:
a third conductive strip of a third width and a third length arranged in the first layer of the interconnect; and
a fourth conductive strip of a fourth width and a fourth length arranged in the second layer of the interconnect;
wherein the third conductive strip and the fourth conductive strip are arranged in parallel with respect to each other in respective layers of the interconnect such that the third conductive strip and the fourth conductive strip form a second directional coupler;
wherein the third conductive strip includes a fifth end configured to couple to the local oscillator and a sixth end opposite relative to the fifth end;
wherein the fourth conductive strip includes a seventh end configured to couple to a second mixer and electromagnetically coupled to the fifth end and an eighth end opposite relative to the seventh end;
wherein the third length of the third conductive strip and the fourth length of the fourth conductive strip are based on the quarter-wavelength of the bandwidth; and
wherein the third width of the third conductive strip and the fourth width of the fourth conductive strip are configured to produce a further coupled gain between the fifth end and the seventh end of the second directional coupler, wherein the further coupled gain is greater than a further throughput gain between the fifth end and the sixth end of the third conductive strip.

12. The device of claim 11, further comprising a resistor coupled to the fourth end of the second conductive strip and to the eighth end of the fourth conductive strip.

13. The device of claim 11, wherein the directional coupler is configured to generate a first signal based on the local oscillator providing a positive signal to the first end of the first conductive strip and provide, via the third end of the first conductive strip, the first signal to the first mixer.

14. The device of claim 13, wherein the second directional coupler is configured to generate a second signal based on the local oscillator providing a negative signal to the fifth end of the third conductive strip and provide, via the seventh end of the fourth conductive strip, the second signal to the second mixer.

15. The device of claim 14, wherein the first signal has a first phase, wherein the second signal has a second phase, and wherein the first signal and the second signal are 90-degrees out-of-phase with respect to each other.

16. The device of claim 11, wherein the bandwidth is approximately between 50 and 85 GHz, and wherein the center frequency for the quarter-wavelength of the bandwidth is approximately 67.5 GHz.

17. The device of claim 16, wherein the coupled gain and the further coupled gain are approximately 2.7 dB, and wherein a first coupling coefficient of the directional coupler and a second coupling coefficient of the second directional coupler are configured such that the coupled gain and the further coupled gain occur at the quarter-wavelength frequency of the bandwidth.

18. A device, comprising:
a first conductive strip of a first width and a first length arranged in a first layer of an interconnect of a substrate;
a second conductive strip of a second width and a second length arranged in a second layer of the interconnect;

a third conductive strip of a third width and a third length arranged in the first layer of the interconnect; and a fourth conductive strip of a fourth width and a fourth length arranged in the second layer of the interconnect;

wherein the first conductive strip and the second conductive strip are arranged in parallel with respect to each other in respective layers of the interconnect such that the first conductive strip and the second conductive strip form a first directional coupler;

wherein the third conductive strip and the fourth conductive strip are arranged in parallel with respect to each other in respective layers of the interconnect such that the third conductive strip and the fourth conductive strip form a second directional coupler;

wherein the first conductive strip includes a first end configured to couple to a local oscillator and includes a second end opposite relative the first end;

wherein the second conductive strip includes a third end configured to couple to a first mixer and electromagnetically coupled to the first end and includes a fourth end opposite relative the third end coupled to a resistor;

wherein the third conductive strip includes a fifth end configured to couple to the local oscillator and a sixth end opposite relative to the fifth end;

wherein the fourth conductive strip includes a seventh end configured to couple to a second mixer and electromagnetically coupled to the fifth end and an eighth end opposite relative to the seventh end coupled to the resistor;

wherein the first length, the second length, the third length, and the fourth length are based on a quarter-wavelength of the center frequency in a bandwidth of the first and second directional couplers;

wherein the first width and the second width are configured to produce a first coupled gain between the first end and the third end of the first directional coupler that is greater than a first throughput gain between the first end and the second end of the first conductive strip; and wherein the third width and the fourth width are configured to produce a second coupled gain between the fifth end and the seventh end of the second directional coupler that is greater than a second throughput gain between the fifth end and the sixth end of the third conductive strip.

19. The device of claim 18, wherein:

the first directional coupler is configured to generate a first signal based on the local oscillator providing a positive signal to the first end of the first conductive strip and provide, via the third end of the first conductive strip, the first signal to the first mixer;

the second directional coupler is configured to generate a second signal based on the local oscillator providing a negative signal to the fifth end of the third conductive strip and provide, via the seventh end of the fourth conductive strip, the second signal to the second mixer;

the first signal has a first phase;

the second signal has a second phase; and the first signal and the second signal are 90-degrees out-of-phase with respect to each other.

20. The device of claim 18, wherein the bandwidth is approximately between 50 and 85 GHz, wherein the quarter-wavelength of the bandwidth is approximately 67.5 GHz, wherein the coupled gain and the further coupled gain are approximately 2.7 dB, and wherein a first coupling coefficient of the directional coupler and a second coupling coefficient of the second directional coupler are configured such that the coupled gain and the further coupled gain occur at the quarter-wavelength frequency of the bandwidth.

* * * * *